(12) United States Patent
Irie

(10) Patent No.: US 6,577,032 B2
(45) Date of Patent: Jun. 10, 2003

(54) RECTIFIER UNIT OF VEHICLE AC GENERATOR

(75) Inventor: Hitoshi Irie, Nagoya (JP)

(73) Assignee: Denso Corporation, Kariya (JP)

(*) Notice: Subject to any disclaimer, the term of this patent is extended or adjusted under 35 U.S.C. 154(b) by 9 days.

(21) Appl. No.: 09/985,826

(22) Filed: Nov. 6, 2001

(65) Prior Publication Data
US 2002/0060502 A1 May 23, 2002

(30) Foreign Application Priority Data
Nov. 21, 2000 (JP) ........................ 2000-354516

(51) Int. Cl.⁷ .............................................. H02K 11/00
(52) U.S. Cl. ......................................... 310/68 D
(58) Field of Search .................. 310/68 D; 363/52, 363/53, 37, 108, 85–89, 125–127; H02K 19/36

(56) References Cited

U.S. PATENT DOCUMENTS 3,927,338 A * 12/1975 Vieilleribiere ............. 310/68 D
5,677,616 A * 10/1997 Ooiwa ........................ 322/17

FOREIGN PATENT DOCUMENTS

JP 7-231656 8/1995
JP 8-205498 8/1996

OTHER PUBLICATIONS

U.S. patent application Ser. No. 09/429,935, Shichijyo, filed Oct. 29, 1999.

* cited by examiner

*Primary Examiner*—Nestor Ramirez
*Assistant Examiner*—Hanh Nguyen
(74) *Attorney, Agent, or Firm*—Oliff & Berridge, PLC

(57) ABSTRACT

A rectifier unit of a vehicle AC generator is comprised of a plurality of metal cases, a plurality of pairs of first and second semiconductor chips and a plurality of pairs of first and second lead wires. The first lead wires are respectively connected to the first semiconductor chips, and the second lead wires are connected to the second semiconductor chips. Each pair of first and second semiconductor chips is disposed in one of the metal cases. The first lead wires are connected to each other to form a first rectifying circuit and second lead wires are connected to form a second rectifying circuit. Therefore, the number of parts for connecting the rectifier circuits can be reduced without providing complicated insulator arrangement.

8 Claims, 4 Drawing Sheets

RECTIFIER UNIT OF VEHICLE AC GENERATOR

CROSS REFERENCE TO RELATED APPLICATION

The present application is based on and claims priority from Japanese Patent Application 2000-354516, filed Nov. 21, 2000, the contents of which are incorporated herein by reference.

BACKGROUND OF THE INVENTION

1. Field of the Invention

The present invention relates to a rectifier unit of a vehicle AC generator for a passenger car, truck or the like.

2. Description of the Related Art

It is known well that a vehicle AC generator is provided with a rectifier unit that includes a pair of three-phase full-wave rectifier circuits. For example, such a rectifier unit is comprised of a positive side heat sink and a negative side heat sink. Each heat sink has six diodes that are force-fitted or soldered thereto. The positive side and negative side heat sinks are fixed by a bolt to a frame of the AC generator with an insulation member being interposed between the heat sinks of the pair. However, because this type of the rectifier unit has twelve diodes, the number of parts and manufacturing steps are comparatively large. It is also difficult to make the size of the AC generator compact.

JP-A8-205498 and JP-A-7-231656 propose a metal case accommodating two semiconductor chips that are different in polarity from each other in order to reduce the number of parts and the size of the AC generator. However, two semiconductor chips that are different in polarity from each other in a metal case necessitates additional expensive structure to insulate the chips and to distinguish the polarity of the semiconductor chips.

SUMMARY OF THE INVENTION

Therefore, a main object of the invention is to provide an improved rectifier unit of a vehicle AC generator that is compact and inexpensive.

According to a feature of the invention, a rectifier unit of a vehicle AC generator including a plurality of metal cases, a pair of first and second semiconductor chips that has the same polarity with each other disposed in each said metal case, a pair of first and second lead wires connected to the pair of first and second semiconductor chips and a pair of first rectifier circuit connected to the first lead wire and second rectifier circuit connected to the second lead wire.

Therefore, the number of metal cases is reduced without providing a complicated insulation arrangement so that manufacturing steps and cost can be reduced.

According to another feature of the invention, the rectifier unit may further include a plurality of insulation members. The insulation member is disposed between the first semiconductor chip and the second semiconductor chip disposed in each metal case.

According to another feature of the invention, a clad metal member of copper layer, iron-nickel layer and copper layer is disposed between the pair of semiconductor chips and the bottom of the metal case.

Therefore, the clad metal member moderates stress caused by a difference in thermal expansion between a solder layer and a pair of the semiconductor chips.

According to another feature of the invention, the rectifier unit may further include a pair of heat sinks having a plurality of mounting holes. Each metal case has a knurled outer surface to be force-fitted to one of the mounting holes of the heat sinks.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
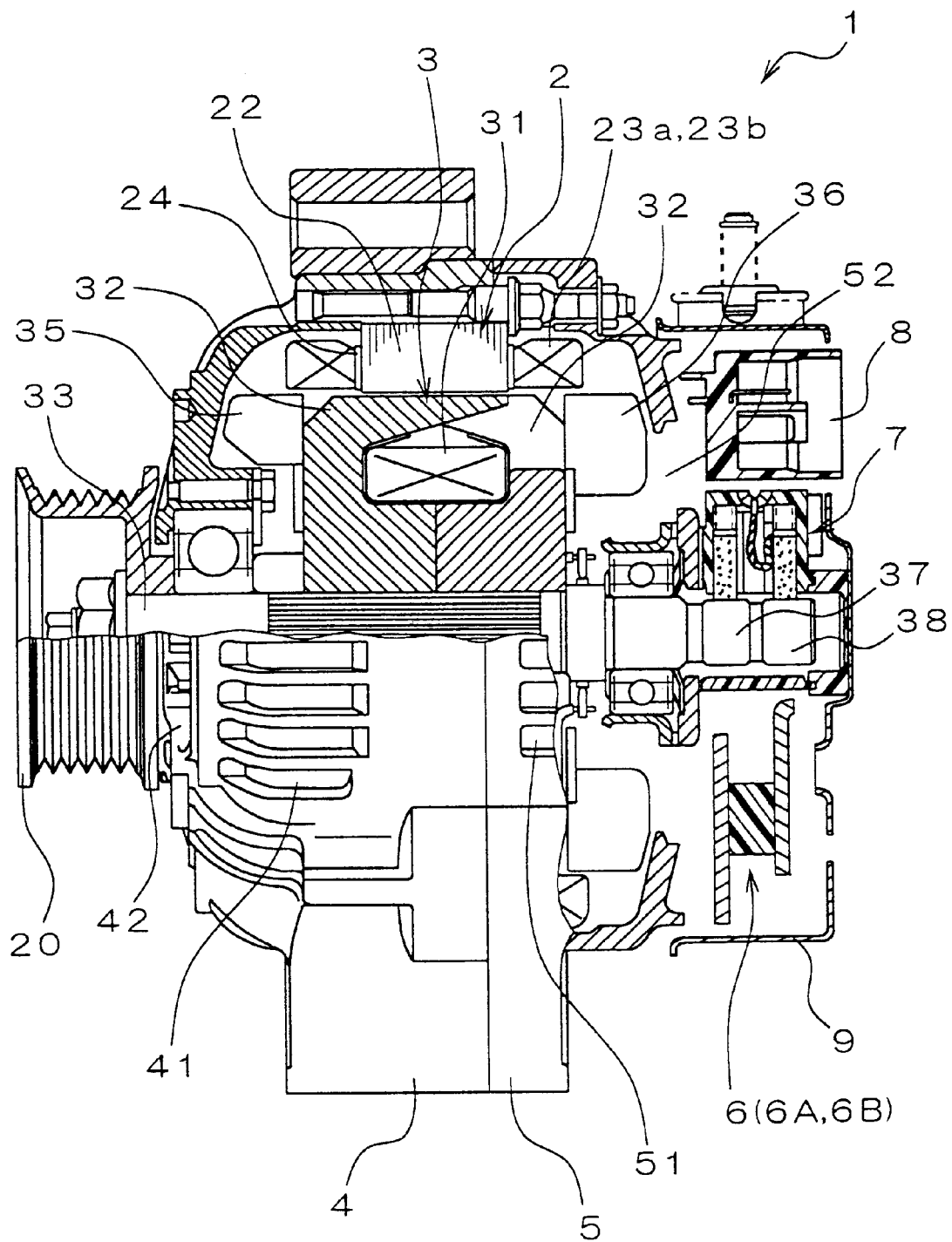
FIG. 1 is an overview of a vehicle AC generator including a rectifier unit according to a preferred embodiment of the invention.

As shown in FIG. 1, a vehicle AC generator 1 with a rectifier unit 6 according to a preferred embodiment of the invention is comprised of a stator 2, a rotor 3, a pair of frames 4 and 5, a brush unit 7, a voltage regulator 8, a rear cover, etc.

The stator 2 is comprised of a stator core 22, a pair of three-phase stator windings 23a and 23b and insulators 24 that insulate the pair of stator windings 23a and 23b from the stator core 22. The stator windings 23a and 23b are wound so that they are shifted 30 degree in electric angle from each other.

The rotor 3, a field coil 31 and a pair of front and rear pole cores 32. The field coil 31 is formed of a cylindrically wound insulator-coated copper wire. The pair of front and rear pole cores 32 has respectively six claw poles and encloses the field coil 31 from opposite ends. The front pole core 32 has a front cooling fan 35 welded to the front end thereof, and the rear pole core 32 has rear cooling fan 36 welded to the rear end thereof. The front cooling fan 35 blows air rearward and radially outward, and the rear cooling fan 36 blows air radially outward. A pair of slip rings 37 and 38 is fixed to a rear end portion of the shaft 33 and electrically connected to the field coil 31 so that the field coil 31 can be supplied field current from the brush unit 7 via the pair of slip rings 37 and 38.

The pair of front and rear frames 4 and 5 accommodates the stator 2 and the rotor 3 therein and supports the stator 2 and the rotor 3 so that the rotor 3 can rotate with the rotor shaft 33 inside the stator 2. The pair of frames 4 and 5 has air discharge windows 41 and 51 at portions corresponding to portions of the stator windings 23a and 23b that project from the opposite axial ends of the stator core 22 and also air intake windows at the opposite axial ends of the pair of frames 4 and 5.

The rectifier unit 6 rectifies three-phase AC power generated by the pair of three-phase stator winding 23a and 23b and provides DC output power. The rectifier unit 6 is comprised of a pair of rectifying circuits 6a and 6b.

The rear cover 9 is fixed to the outside of the frame 5 to cover the rectifier unit 6, the brush unit 7 and the voltage regulator 8.

The vehicle AC generator 1 is driven by an engine via a pulley 20. When the rotor 3 rotates and field current is supplied to the field coil 31, the pair of pole cores 32 with the claw poles are excited so that the stator windings 23a and 23b generate three-phase AC power.

Figure 2:
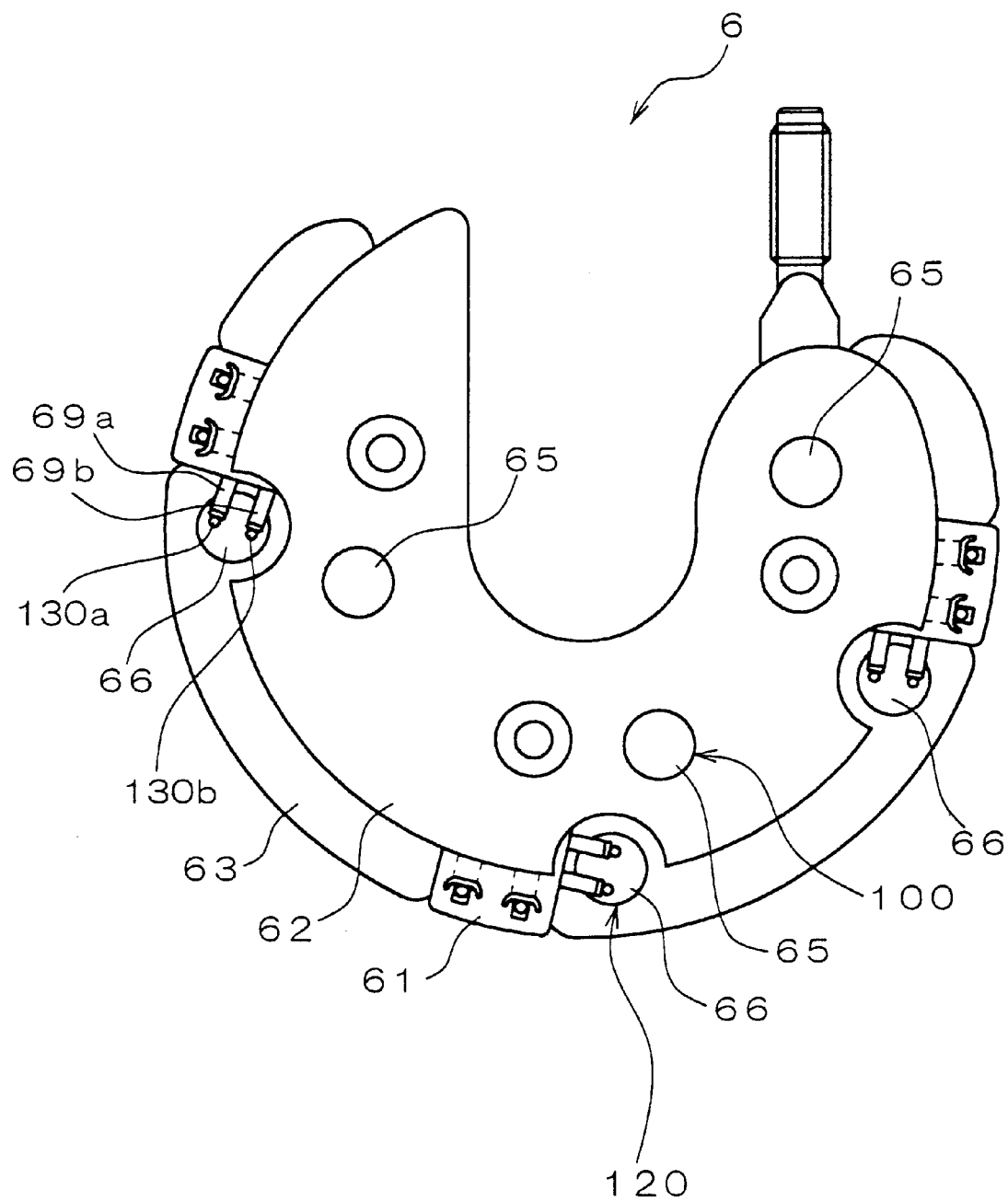
FIG. 2 is a plan view of the rectifier unit according to the preferred embodiment.

As shown in FIG. 2, the rectifier unit 6 is comprised of a pair of a negative heat sink 62 and a positive heat sink 63, a terminal unit 61, three negative side rectifier elements 65, and three positive side rectifier elements 66. The terminal unit 61 is disposed between the negative heat sink 62 and the positive heat sink 63, the negative side rectifier elements are fixed to the negative heat sink 62, and the positive side rectifier elements are fixed to the positive heat sink 63.

The positive heat sink 63 is disposed inside the rear cover 9. The positive heat sink is an arc-shaped member having approximately the same outside diameter as the inside diameter of the rear cover 9 and has three mounting holes 120 formed at intervals along a circumferential portion thereof. Positive side rectifier elements 66 are respectively force-fitted to the mounting holes 120. A pair of leads 130a and 130b extends from each one of the positive side rectifier elements 66 and is respectively welded to connection electrodes 69a and 69b of the terminal unit 61.

The negative heat sink 62 is an arc member having the outside diameter thereof smaller than outside diameter of the positive heat sink 63 and has three mounting holes 100 formed at intervals along a circumferential portion thereof. Negative side rectifier elements 65 are respectively force-fitted to the mounting holes 100. A pair of leads also extends from each one of the negative side rectifier elements 65 and is respectively welded to connection electrodes of the terminal unit 61 in the same manner as the positive side rectifier elements 66.

Figure 3:
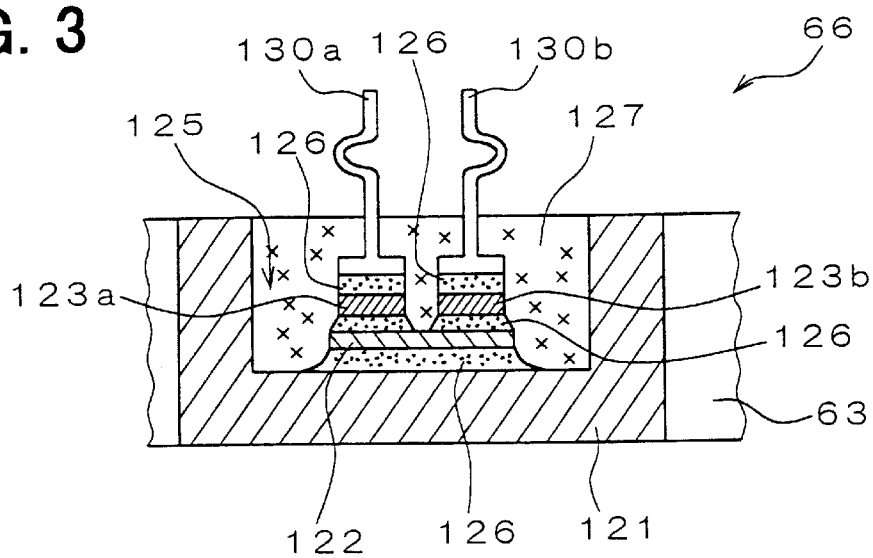
FIG. 3 is a cross-sectional side view of a pair of semiconductor chips and a metal case of a rectifier element of the rectifier unit according to the preferred embodiment.
Figure 4:
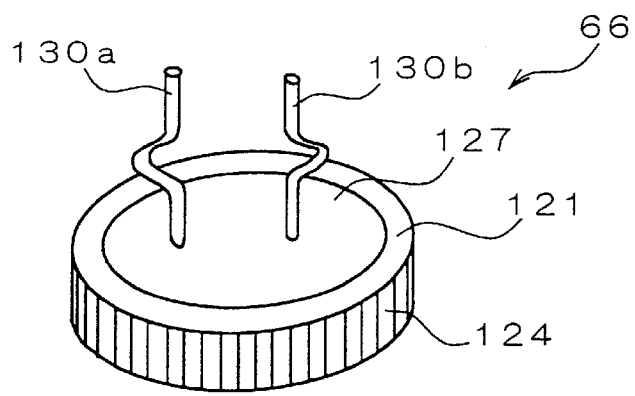
FIG. 4 is a perspective view of the exterior of the rectifier element shown in FIG. 3.
Figure 5:
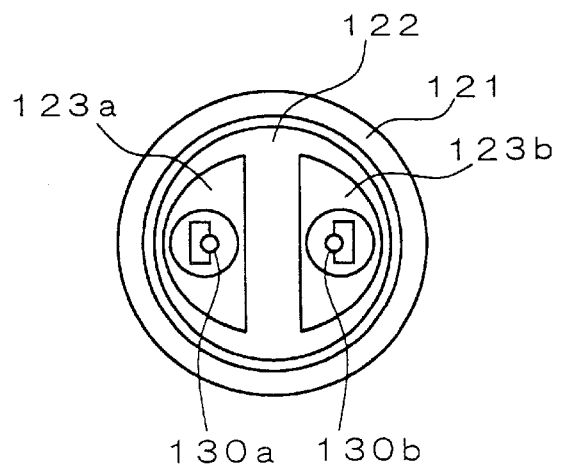
FIG. 5 is a plan view illustrating the inside of the rectifier element shown in FIG. 4.

As shown in FIG. 3, the positive side rectifier element 66 includes a metal case 121, a metal plate 122, a pair semiconductor chips 123a and 123b having the same polarity, a lead 130a and a lead 130b. The metal case 121 has a knurled cylindrical outer surface 124 and a cup-shaped hollow cylindrical portion 125 that has a bottom. The metal plate 122 is soldered to the bottom (a solder layer is indicated by a reference numeral 126) of the hollow cylindrical portion 125. The semiconductor chips 123a and 123b are soldered to the metal plate 122, and the leads 130a and 130b are respectively soldered to the semiconductor chips 123a and 123b.

The metal plate 122 is a three-layer-clad metal that is comprised of a copper layer, an iron-nickel layer and a copper layer. The metal plate 122 eases stress caused by a difference in thermal expansion between the solder layer 126 and the semiconductor chips 123a and 123b. Sealing material 127 is filled in the hollow cylindrical portion 125 to protect the semiconductor chips 123a and 123b.

Figure 6:
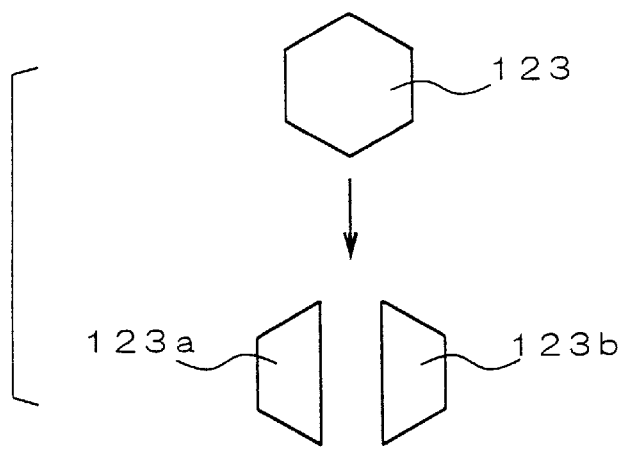
FIG. 6 is a schematic diagram illustrating a step of forming the pair of semiconductor chips shown in FIG. 3.
Figure 7:
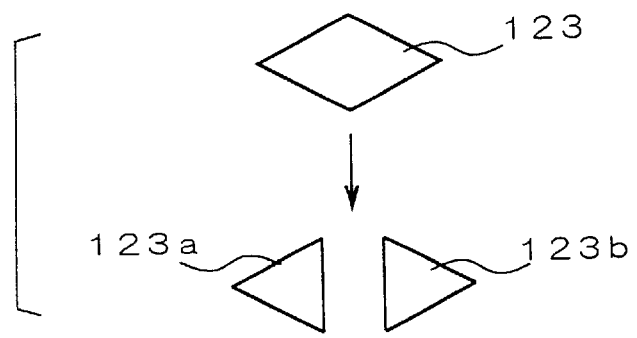
FIG. 7 is a schematic diagram illustrating a variation of the step of forming the semiconductor chips shown in FIG. 6.

The pair of semiconductor chips 123a and 123b for the positive side rectifier element 66 is formed of a common semiconductor chip 123. The conventional chip 123 is cut into two pieces of the same size and shape, as shown in FIGS. 6 and 7. Another pair of semiconductor chips for the negative side rectifier element 65 is also formed of a common semiconductor chip in the same manner as the positive side semiconductor chips 123a and 123b.

One of leads that extend from the negative side rectifier element 65 and one of the leads 130a that extend from the positive side rectifier elements 66 are jointly connected to the connection electrode 69a of the terminal unit 61 to form a three-phase full-wave rectifying circuits 6a. One of leads that extend from the negative side rectifier element 65 and one of the leads 130b that extend from the positive side rectifier elements 66 are jointly connected to the connection electrode 69b of the terminal unit 61 to form the other three-phase full-wave rectifying circuits 6b.

Figure 8:
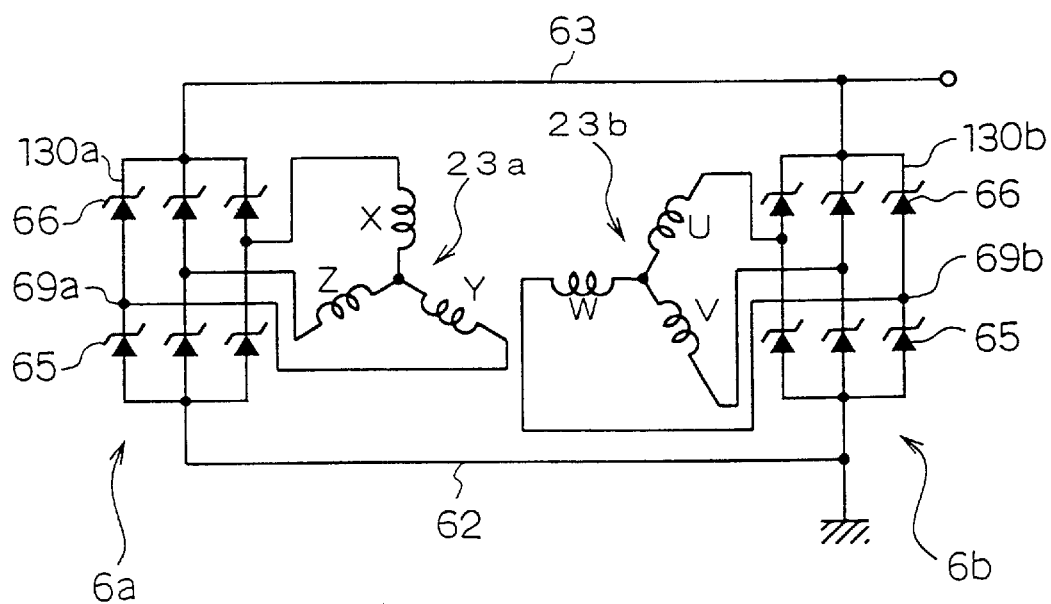
FIG. 8 is a circuit diagram of the vehicle AC generator shown in FIG. 1.

As shown in FIG. 8, phase windings X, Y and Z of the stator winding 23a are connected to the three-phase full-wave rectifying circuit 6a, and phase windings U, V and W of the stator winding 23b are connected to the three-phase full-wave rectifying circuit 6b.

Thus, a pair of negative side semiconductor chips is mounted in each of the metal cases of the negative side rectifier element 65, and a pair of positive side semiconductor chips is mounted in each of the metal cases of the positive side rectifier element 66. Therefore, it is not necessary to insulate the pair of semiconductor chips from each other.

The negative and positive side rectifier elements 65 and 66 can be fixed to the respective heat sinks by means of soldering instead of force-fitting.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A rectifier unit of a vehicle AC generator comprising:
   a plurality of metal cases;
   a plurality of pairs of first and second semiconductor chips having the same polarity with each other, each said pair of first and second semiconductor chips being disposed in one of said metal cases;
   a plurality of pairs of first and second lead wires, each said pair of first and second lead wires being respectively connected to one of said pairs of semiconductor chips; and
   a pair of first rectifier circuit connected to said first lead wires and second rectifier circuit connected to said second lead wires.

2. The rectifier unit as claimed in claim 1, further comprising a plurality of insulation members, each of which is disposed between said first semiconductor chip and said second semiconductor chip disposed in one of said metal cases.

3. The rectifier unit as claimed in claim 2, further comprising a plurality of clad metal members of copper layer, iron-nickel layer and copper layer, each of which is disposed between said first and second semiconductor chips and a bottom of one of said metal cases.

4. The rectifier unit as claimed in claim 1, further comprising a pair of heat sinks having a plurality of mounting holes, wherein
   each of said metal case has a knurled outer surface to be force-fitted to one of said mounting holes of one of said pair of heat sinks.

5. A rectifier unit of a vehicle AC generator having a pair of three phase stator windings, said rectifier unit comprising:

a positive heat sink having three metal cases electrically connected thereto;

a negative heat sink having three metal cases electrically connected thereto;

three pairs of positive side semiconductor chips , each said pair of positive side semiconductor chips being disposed in one of said metal cases of said positive heat sink;

three pairs of negative side semiconductor chips , each said pair of negative side semiconductor chips being disposed in one of said metal cases of said negative heat sink;

a plurality of pairs of first and second positive side lead wires, a pair of first and second positive side lead wires being respectively connected to said three pairs of positive side semiconductor chips; and a plurality of pairs of first and second negative side lead wires, a pair of first and second negative side lead wires being respectively connected to said three pairs of negative side semiconductor chips; wherein a first three-phase full-wave rectifier circuit comprises a circuit connected to said first positive side and first negative side lead wires; and a second three-phase full-wave rectifier circuit comprises a circuit connected to said second positive side and negative side lead wires.

6. The rectifier unit as claimed in claim 5, wherein a clad metal member of copper layer, iron-nickel layer and copper layer is disposed between said pair of first and second positive side semiconductor chips and a bottom of said metal case.

7. The rectifier unit as claimed in claim 6, wherein a clad metal member of copper layer, iron-nickel layer and copper layer is disposed between said pair of first and second negative side semiconductor chips and a bottom of said metal case.

8. A rectifier unit of a vehicle AC generator having a pair of three phase stator windings, said rectifier unit comprising:

a positive heat sink having three metal cases electrically connected thereto, each said metal case accommodating a pair of positive side semiconductor chips;

a negative heat sink having three metal cases electrically connected thereto, each said metal case accommodating a pair of positive side semiconductor chips;

three pairs of first and second positive side lead wires respectively connected to said three pairs of positive side semiconductor chips; and three pairs of first and second negative side lead wires respectively connected to said three pairs of negative side semiconductor chips; wherein a first three-phase full-wave rectifier circuit comprises a circuit connected to said first positive side and first negative side lead wires; and a second three-phase full-wave rectifier circuit comprises a circuit connected to said second positive side and negative side lead wires.

* * * * *